United States Patent
Yeo

(10) Patent No.: US 6,218,252 B1
(45) Date of Patent: Apr. 17, 2001

(54) METHOD OF FORMING GATE IN SEMICONDUCTOR DEVICE

(75) Inventor: In Seok Yeo, Kyoungki-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/472,201

(22) Filed: Dec. 27, 1999

(30) Foreign Application Priority Data

Dec. 28, 1998 (KR) .................................. 98-59550

(51) Int. Cl.$^7$ ...................................... H01R 13/62
(52) U.S. Cl. ..................... 438/305; 438/301; 438/307; 438/586; 438/592; 438/656; 438/704
(58) Field of Search .................... 438/305, 303, 438/307, 656, 301, 586, 592, 704, 674, 680, 935

(56) References Cited

U.S. PATENT DOCUMENTS

| 5,071,788 | 12/1991 | Joshi ........................ 438/586 |
| 5,599,725 | 2/1997 | Dorleans et al. .................... 438/586 |
| 5,783,478 | * 7/1998 | Chau et al. ........................ 438/592 |
| 6,091,120 | * 7/2000 | Yeom et al. ....................... 257/401 |

FOREIGN PATENT DOCUMENTS

| 0697714A1 | * 2/1996 | (EP) ................ H01L/21/285 |
| 2247349A | * 2/1992 | (GB) ................ H01L/21/336 |
| 363042173A | * 2/1988 | (JP) ......................... 438/656 |

* cited by examiner

Primary Examiner—Matthew Smith
Assistant Examiner—Igwe U. Anya
(74) Attorney, Agent, or Firm—Jacobson, Price, Holman & Stern, PLLC

(57) ABSTRACT

Disclosed herein is a method of forming a gate in a semiconductor device capable of preventing a deterioration in the property of a gate electrode formed of a refractory metal in a heat treatment process. This method comprises steps of: depositing sequentially a gate insulation film, a PVD TiN film, a doped silicone layer, a diffusion barrier film, a refractory metal film for a gate electrode and a first CVD insulation film, on a semiconductor substrate; etching the first CVD insulation film, the refractory metal film, the diffusion barrier film, and the doped silicone layer using a gate electrode mask to form the gate electrode while exposing the TiN film; implanting lightly-doped impurity ions into the semiconductor substrate using the gate electrode as a mask; forming spacers formed of a second CVD insulating film on side walls of the gate electrode; wet-etching the TiN film in such a manner that only a portion of the TiN film disposed beneath the gate electrode between the spacers remains; and implanting heavily-doped impurity ions into the semiconductor substrate using the gate electrode and the spacers as a mask to form an impurity junction region of an LDD structure.

16 Claims, 3 Drawing Sheets

METHOD OF FORMING GATE IN SEMICONDUCTOR DEVICE

BACKGROUND OF THE INVENTION

1. Field of the Invention

The present invention relates in general to a method of forming a gate in a semiconductor device, and more particularly to a method of forming a gate in a semiconductor device which is capable of preventing a degradation in the property of the device due to an oxidation of a refractory metal used as a gate electrode in a heat treatment process under an oxidation atmosphere that is carried out for the purpose of an improvement in a film quality of a gate oxide film.

2. Description of the Prior Art

Generally, for a gate electrode in a semiconductor device, doped polysilicon is most often used.

The gate electrode using such a polysilicon is advantageous in that it provides a process stability. Such a gate electrode, however, is problematic in an improvement in the operating speed of the device owing to a high resistivity of the polysilicon as the design rule is made smaller.

To resolve such a problem, a method has been proposed in which a refractory metal, such as tungsten, low in resistivity, is used for the gate electrode.

FIG. 1 is a cross-sectional view showing a method of forming a gate in a semiconductor using tungsten as the refractory metal according to the prior art. Referring to FIG. 1, the method of forming the gate according to the prior art comprises forming a gate oxide film 22 on a semiconductor device 21 to a desired thickness. A tungsten film 26 for a gate electrode is deposited on the resultant structure.

Then, a mask insulation film 27 is formed on the tungsten film 26. At this time, the mask insulation film 27 is formed by a chemical vapor deposition (hereinafter, called "CVD").

After forming a photoresist pattern (not shown) on the mask insulation film 27, the photoresist pattern is exposed to light using a gate electrode mask (not shown) and then developed to form a photoresist film pattern (not shown). Then, using the photoresist film pattern as a mask, the mask insulation film 27 and the tungsten film 26 are patterned to form a gate electrode.

Thereafter, in order to improve a film quality of the gate oxide 22 damaged during the patterning process and to form an oxide film to be used in an LDD ion implantation process, the resultant structure is heat-treated under an oxidation atmosphere.

Afterwards, a lightly-doped impurity junction region (not shown) is formed on the semiconductor substrate 21 using the gate electrode as a mask.

After that, the insulation film spacers (not shown) are formed on side walls of the gate electrode.

Subsequently, using the gate electrode and the insulation film spacers as masks, a heavily-doped impurity junction region is formed, thereby forming an LDD structure.

The method of forming the gate electrode as shown in FIG. 1 has an advantage of being a simple process. However, where the tungsten film is exposed in the thermal oxidation process to oxidize the tungsten film, a tungsten oxide film ($WO_3$) that is a volatile material, is formed causing the shape of the gate electrode to be broken.

Since the gate electrode having the broken shape has an effect on the subsequent process such as an ion implantation process or a thin film deposition, the desired properties of the device cannot be obtained.

To resolve such a disadvantage, an "Wet Hydrogen Oxidation" process has been proposed by N. Yamamoto, et al., in Journal of Electrochemical Society, Vol. 133, p.401 (1986). However, this process must involve an oxidation process at a high temperature, such as about 1,000° C., for a lengthy period of time in order to obtain the necessary thickness of the oxide film. This results in a great degree of deterioration in the thermal property of a 4 GIGA memory device in which a metal gate electrode will be used.

In addition, carrying out the heat treatment under a nitrogen atmosphere to avoid the thermal property deterioration causes a significant problem compared to the case of carrying out the heat treatment under the oxygen atmosphere.

SUMMARY OF THE INVENTION

It is therefore an objective to provide a method of forming a gate in a semiconductor device, capable of preventing a deterioration in the property of a gate electrode formed of a refractory metal in a heat treatment for improving the film quality of a gate oxide film damaged at a patterning process of the gate electrode and for forming an oxide film to be used at an LDD ion implantation, thereby allowing the semiconductor device to have a highly integrated degree.

In accordance with a first example of the invention, a method for forming a gate in a semiconductor device comprises steps of: sequentially forming a gate insulation film, a TiN film, a doped silicon layer and a refractory metal film for a gate electrode on a semiconductor substrate;
  etching the refractory metal film and the doped silicone layer using a gate electrode mask to form the gate electrode while exposing the TiN film;
  implanting lightly-doped impurity ions into the semiconductor substrate using the gate electrode as a mask;
  forming spacers comprised a CVD insulation film on side walls of the gate electrode, respectively;
  wet-etching the TiN film in such a manner that only a 10 portion of the TiN film disposed beneath the gate electrode between the spacers remains; and
  implanting heavily-doped impurity ions into the semiconductor substrate using the gate electrode and the spacers as a mask to form an impurity junction region of a LDD structure.

In accordance with a second example of the invention, a method for forming a gate in a semiconductor device comprises steps of: forming sequentially a gate insulating film, a TiN film by a physical vapor deposition (hereinafter, called "PVD"), a doped silicone layer for an etch-preventing film, a diffusion barrier film, a refractory metal film for a gate electrode and a first CVD insulation film on a semiconductor substrate; etching the first CVD insulation film, the refractory metal film, the diffusion barrier film, and the doped silicone layer using a gate electrode mask to form the gate electrode while exposing the TiN film; implanting lightly-doped impurity ions into the semiconductor substrate using the gate electrode as a mask; forming spacers formed of a second CVD insulation film on side walls of the gate electrode, respectively; wet-etching the TiN film in such a manner that only a portion of the TiN film disposed beneath the gate electrode between the spacers remains; and implanting heavily-doped impurity ions into the semiconductor substrate using the gate electrode and the spacers as a mask to form an impurity junction region of an LDD structure.

BRIEF DESCRIPTION OF THE DRAWINGS

The foregoing and other objectives, features and advantages of the invention will be apparent to those skilled in the art to which the present invention relates from reading the following specification with reference to the accompanying drawings, in which:

FIG. 1 is a cross-sectional view showing a method of forming a gate in a semiconductor device according to the prior art.

DESCRIPTION OF THE PREFERRED EMBODIMENTS

A method of forming a gate in a semiconductor device according to the invention will now be described in detail.

Figure 1:
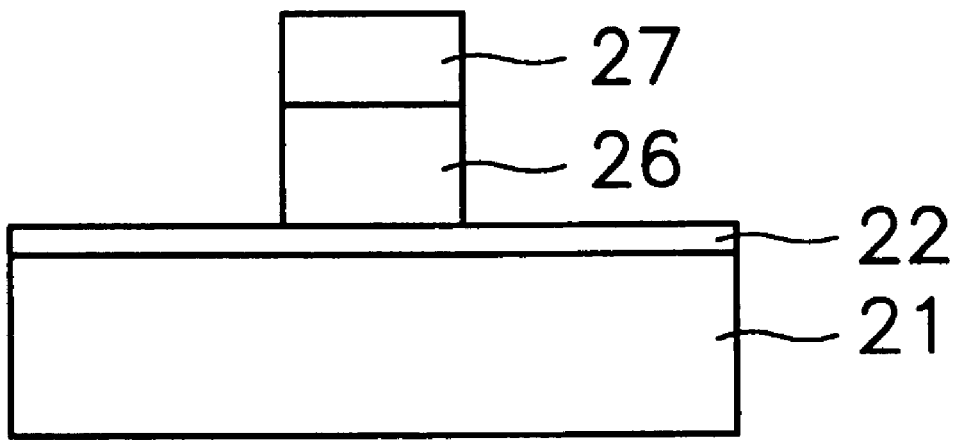
Figure 2:
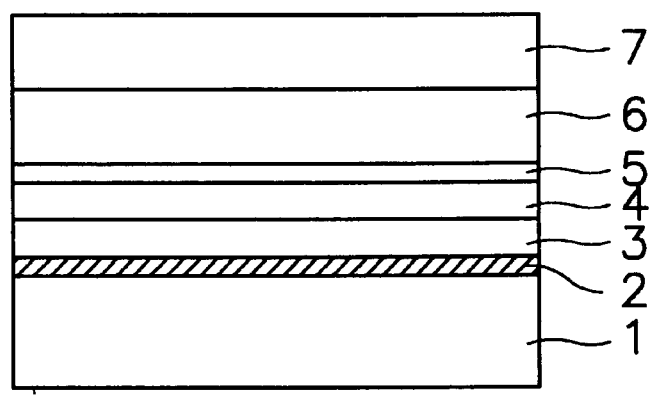
FIG. 2 through FIG. 5 are cross-sectional views sequentially showing a method of forming a gate in a semiconductor device according to the invention.

As shown in FIG. 2, a method of forming a gate in a semiconductor device according to the invention comprises forming a device isolation region (not shown) on an inactive region of a semiconductor substrate 1.

Then, on the overall surface of the resultant structure, a gate oxide film 2, a PVD TiN film 3, a doped silicone layer 4, a diffusion barrier film 5, a refractory metal film 6, and a first CVD oxide film 7 are deposited sequentially. At this point, the TiN 3 is formed to have a thickness of 50 to 100 Å, but the electric power used for the formation of such a TiN film is preferably low so that the underlying gate oxide layer is damaged as little as possible. Moreover, the doped silicone layer 4 is formed of polysilicon or amorphous silicone. The doped silicon layer 4 is used as a wet etch-preventing film.

The diffusion barrier film is formed of TiN or WN to a thickness of 50 to 300 Å. The refractory metal film 6 is formed of a tungsten film to a thickness of 100 to 2000 Å.

Figure 3:
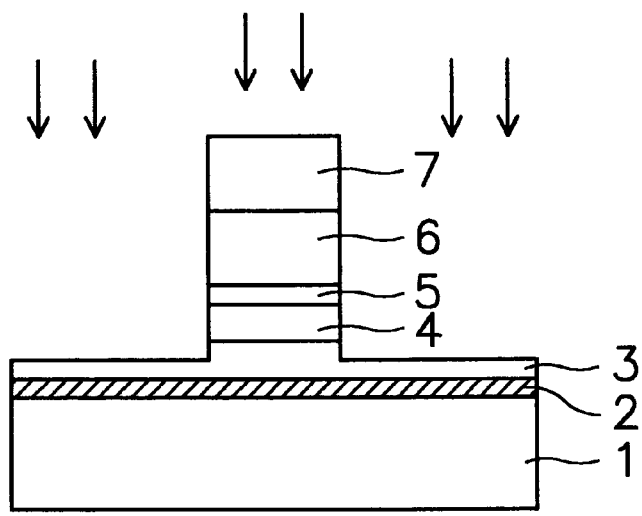

Afterwards, as shown in FIG. 3, the first CVD oxide film 7, the refractory metal film 6, the diffusion barrier film 5, 10 and the doped silicone layer 4 are etched using a gate electrode mask (not shown) to form a gate electrode while exposing the TiN film 3. At this time, the etch using the gate electrode mask involves an overetch by which the TIN film is over etched to a desired thickness. Concretely speaking, the etch using such a gate electrode mask comprises applying a photoresist film on the first CVD oxide film 7, exposing the applied photoresist film to light using the gate electrode mask, developing the exposed portion of the photoresist film, thereby forming a pattern of the photoresist film, and etching the films arranged beneath the photoresist film pattern while using the photoresist film pattern as a mask.

Thereafter, using the gate electrode as a mask, lightly-doped impurity ions are implanted into the semiconductor substrate 1 to form a lightly-doped impurity junction region (not shown). In the ion implantation process, ions are implanted at a concentration of about 1E13 to about 5E14 ions.

Figure 4:
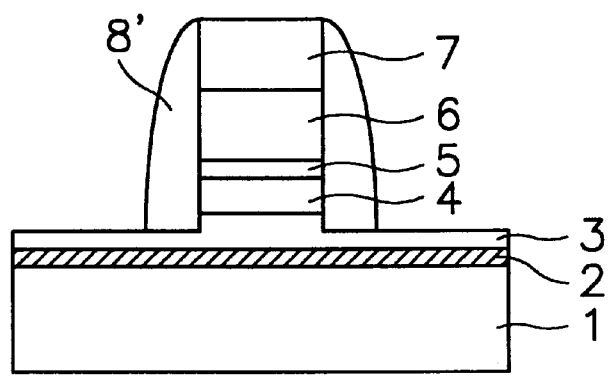

Then, as shown in FIG. 4, spacers 8 made of a second CVD oxide film are formed on respective side walls of the gate electrode formed at the etch process using the gate electrode mask. At this time, the formation of the spacers 8 is achieved by depositing the second CVD oxide film(not shown) on the overall surface of the resultant structure and then anisotropically etching the deposited second CVD oxide film.

Figure 5:
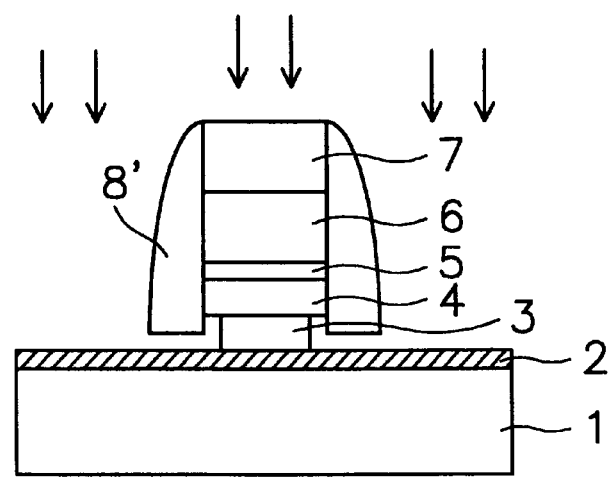

Subsequently, as shown in FIG. 5, the over-etched TiN film 3 is etched by a wet process in such a fashion that only its portion disposed beneath the gate electrode between the spacers 8 remains. At this time, the wet etch process is carried out using a chemical solution based on $H_2O_2$.

Then, using the gate electrode and the spacers 8 as a mask, heavily-doped impurity ions are implanted into the semiconductor substrate 1 to form an impurity junction region of an LDD structure (not shown).

As described above, the method of forming the gate in the semiconductor device arranges an insulation film around the refractory metal for the gate electrode. Therefore, in the thermal oxidation process for compensating the damage of the gate oxide, deterioration in the property of the gate electrode can be prevented, thereby allowing the semiconductor device to possess a highly integrated degree. This results in an improvement in the property and reliability of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a gate in semiconductor device comprising steps of:

sequentially forming a gate insulation film, a TiN film, a doped silicon layer and a refractory metal film for a gate electrode on a semiconductor substrate;

etching the refractory metal film and the doped silicone layer using a gate electrode mask to form the gate electrode while exposing the TiN film;

implanting lightly-doped impurity ions into the semiconductor substrate using the gate electrode as a mask;

forming spacers comprised a CVD insulation film on side walls of the gate electrode, respectively;

wet-etching the TiN film in such a manner that only a portion of the TiN film disposed beneath the gate electrode between the spacers remains; and implanting heavily-doped impurity ions into the semiconductor substrate using the gate electrode and the spacers as a mask to form an impurity junction region of a LDD structure.

2. The method of claim 1, wherein the TiN film is formed to have a thickness of 50 to 100 Å.

3. The method of claim 1, wherein further comprises steps of: forming a diffusion barrier film on the doped silicon layer; and forming a CVD insulating film on the refractory metal film.

4. The method of claim 3, wherein the diffusion barrier film is formed of a TiN or WN metal to a thickness of 50 to 300 Å.

5. The method of claim 1 wherein the doped silicon layer is formed of a polysilicon layer or an amorphous silicone layer.

6. The method of claim 1 wherein the refractory metal is formed to have a thickness of 100 to 2000 Å.

7. The method of claim 1 wherein the lightly-doped impurity ions are implanted at a concentration of 1E13 to 5E14 ions.

8. The method of claim 1 wherein the wet-etching step is carried out using a $H_2O_2$-based chemical solution.

9. The method of claim 1, wherein the doped silicon layer is used as an etch-preventing film.

10. A method of forming a gate in a semiconductor device comprising steps of:

sequentially forming a gate insulation film, a PVD TiN film, a doped silicon layer for an etch-preventing film, a diffusion barrier film, a refractory metal film for a gate electrode, and a first CVD insulation film, on a semiconductor substrate;

etching the first CVD insulation film, the refractory metal film, the diffusion barrier film, and the doped silicon layer using a gate electrode mask to form the gate electrode while exposing the TiN film;

implanting lightly-doped impurity ions into the semiconductor substrate using the gate electrode as a mask;

forming spacers formed of a second CVD insulation film on side walls of the gate electrode, respectively;

wet-etching the TiN film in such a manner that only a portion of the TiN film disposed beneath the gate electrode between the spacers remains; and implanting heavily-doped impurity ions into the semiconductor substrate using the gate electrode and the spacers as a mask to form an impurity junction region of a LDD structure.

11. The method of claim 10, wherein the TiN film is formed to have a thickness of 50 to 100 Å.

12. The method of claim 10, wherein the diffusion barrier film is formed of a TiN or WN metal to a thickness of 50 to 300 Å.

13. The method of claim 10, wherein the doped silicone layer is formed of a polysilicon layer or an amorphous silicone layer.

14. The method of claim 10, wherein the refractory metal is formed to have a thickness of 100 to 2000 Å.

15. The method of claim 10, wherein the lightly-doped impurity ions are implanted at a concentration of 1E13 to 5E14 ions.

16. The method of claim 10, wherein the wet-etching step is carried out using a $H_2O_2$-based chemical solution.

* * * * *